(12) United States Patent
Lee (10) Patent No.: US 10,923,193 B2
(45) Date of Patent: Feb. 16, 2021

(54) MEMORY DEVICE INCLUDING VOLTAGE GENERATING CIRCUIT

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/749,657

(22) Filed: Jan. 22, 2020

(65) Prior Publication Data

US 2020/0160915 A1 May 21, 2020

Related U.S. Application Data

(62) Division of application No. 15/824,454, filed on Nov. 28, 2017, now Pat. No. 10,580,496.

(30) Foreign Application Priority Data

Apr. 26, 2017 (KR) .................. 10-2017-0053861

(51) Int. Cl.
| | |
|---|---|
| *G11C 16/10* | (2006.01) |
| *G11C 16/12* | (2006.01) |
| *G11C 16/04* | (2006.01) |
| *G11C 16/30* | (2006.01) |
| *G11C 16/24* | (2006.01) |
| *G11C 16/08* | (2006.01) |
| *G11C 16/14* | (2006.01) |
| *H01L 27/11582* | (2017.01) |

(52) U.S. Cl.
CPC .......... *G11C 16/12* (2013.01); *G11C 16/0483* (2013.01); *G11C 16/08* (2013.01); *G11C 16/10* (2013.01); *G11C 16/14* (2013.01); *G11C 16/24* (2013.01); *G11C 16/30* (2013.01); *H01L 27/11582* (2013.01)

(58) Field of Classification Search
CPC ................................ G11C 16/10; H01L 29/04
USPC ..................................... 365/185.18
See application file for complete search history.

(56) References Cited

U.S. PATENT DOCUMENTS

2016/0343450 A1* 11/2016 Lee ................... H01L 27/11556

* cited by examiner

*Primary Examiner* — Jason Lappas
(74) *Attorney, Agent, or Firm* — IP & T Group LLP (57) ABSTRACT

Provided herein may be a memory device including a voltage generating circuit. The memory device may include a memory block including a channel layer formed between junctions included in a well, and a source select line, word lines, and drain select lines that are sequentially stacked on the well while enclosing the channel layer, a first voltage source configured to generate a first operating voltage to be applied to the well during a program operation or an erase operation, and a second voltage source configured to generate a second operating voltage to be applied to source lines that are coupled to the junctions during the program operation or the erase operation.

10 Claims, 11 Drawing Sheets

MEMORY DEVICE INCLUDING VOLTAGE GENERATING CIRCUIT

CROSS-REFERENCE TO RELATED APPLICATION

This application is a division of U.S. patent application Ser. No. 15/824,454 filed on Nov. 28, 2017, which claims benefits of priority of Korean Patent Application No. 10-2017-0053861 filed on Apr. 26, 2017. The disclosure of each of the foregoing application is incorporated herein by reference in its entirety.

BACKGROUND

Field of Invention

Various embodiments of the present disclosure generally relate to a memory device including a voltage generating circuit, and more particularly, to a voltage generating circuit including a plurality of voltage sources and a memory device including the voltage generating circuit.

Description of Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As the memory device having a 2D structure is reaching its physical scaling limit, semiconductor manufacturers are producing memory devices having a 3D structure that include memory cells vertically stacked on a semiconductor substrate.

SUMMARY

Various embodiments of the present disclosure are directed to a memory device including a voltage generating circuit, which can improve the reliability of a memory device.

An embodiment of the present disclosure may provide for a memory device. The memory device may include a memory block including a channel layer formed between junctions included in a well, and a source select line, word lines, and drain select lines that are sequentially stacked on the well while enclosing the channel layer, a first voltage source configured to generate a first operating voltage to be applied to the well during a program operation or an erase operation, and a second voltage source configured to generate a second operating voltage to be applied to source lines that are coupled to the junctions during the program operation or the erase operation.

An embodiment of the present disclosure may provide for a memory device. The memory device may include a memory block formed on a well and configured to include strings coupled between a source line and bit lines, and peripheral circuits configured to selectively apply operating voltages to the source line and the well, respectively, through different voltage sources during a program operation or an erase operation of memory cells included in the strings.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1:
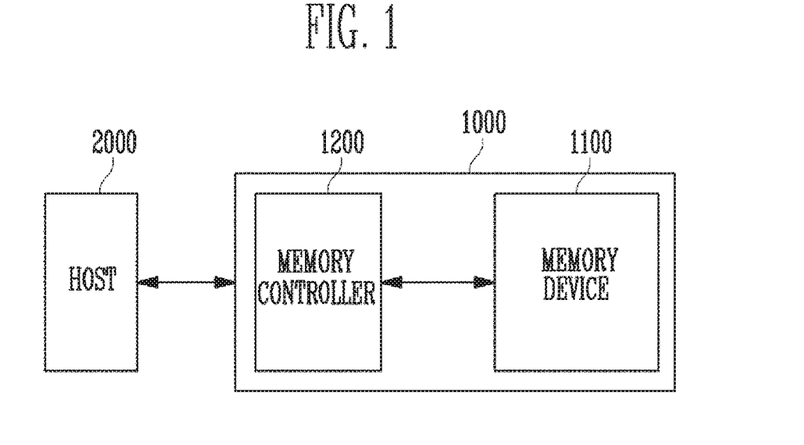
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 using an interface protocol such as a peripheral component interconnect-express (PCI-e), an advanced technology attachment (ATA), a serial ATA (SATA), a parallel ATA (PATA) or a serial attached SCSI (SAS). In addition, the interface protocol provided for the purpose of data communication between the host 2000 and the memory system 1000 is not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data that is loaded for the program operation.

The memory device 1100 may perform a program operation, a read operation or an erase operation under the control of the memory controller 1200.

Figure 2:
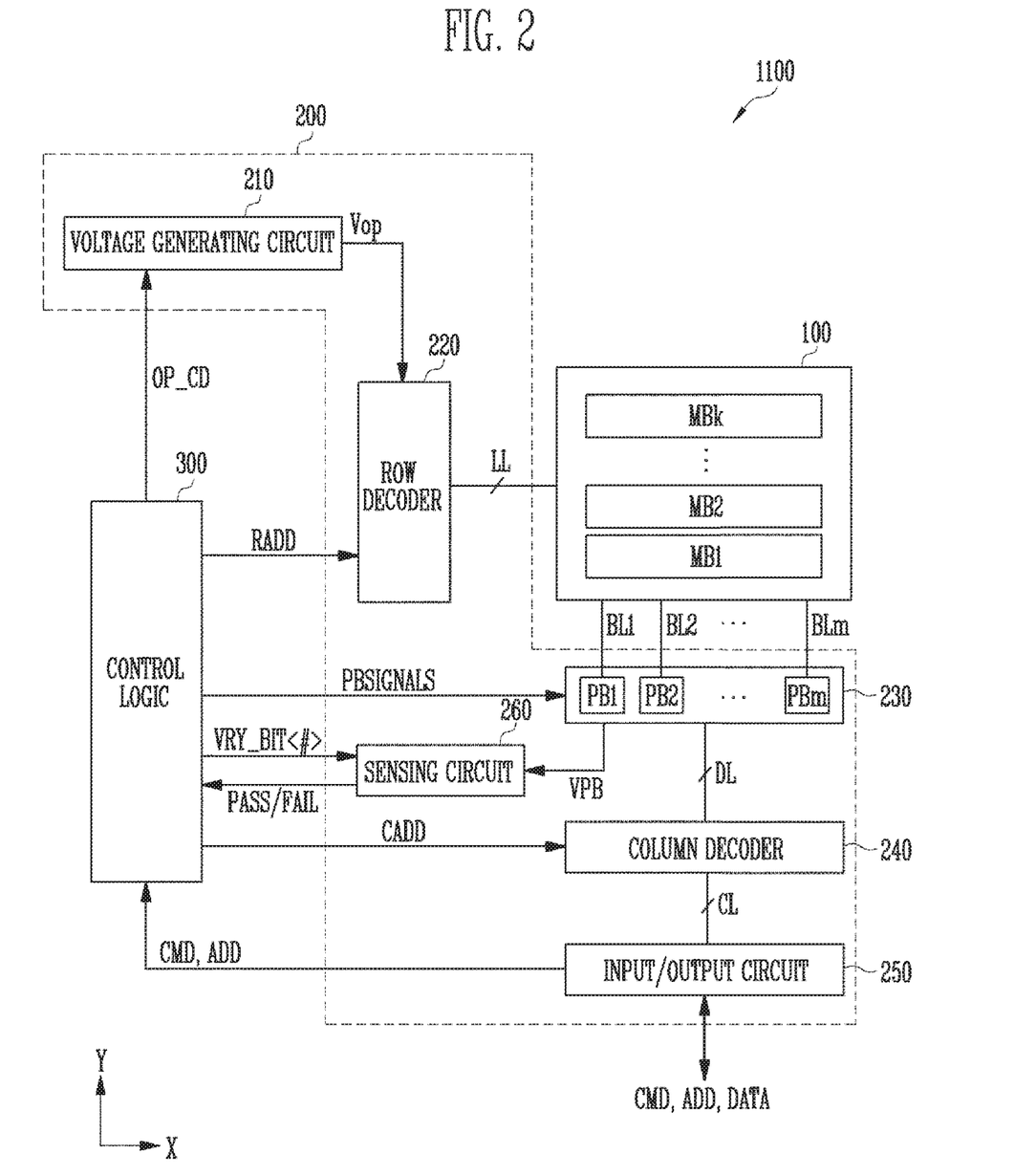
FIG. 2 is a diagram illustrating a memory device in accordance with an embodiment of the present disclosure.

FIG. 2 is a diagram illustrating a memory device in accordance with an embodiment of the present disclosure, for example, the memory device 1100 of FIG. 1.

Referring to FIG. 2, the memory device 1100 may include a memory cell array 100 in which data is stored. The memory device 1100 may include a peripheral circuit 200 configured to perform a program operation that stores data in the memory cell array 100, a read operation that outputs stored data in the memory cell array 100, and an erase operation that erases stored data in the memory cell array 100. The memory device 1100 may include a control logic 300 that controls the peripheral circuit 200 under the control of a memory controller for example, the memory controller 1200 of FIG. 1.

The memory cell array 100 may include a plurality of memory blocks MB1 to MBk, where k is a positive integer. Local lines LL and bit lines BL1 to BLm, where m is a positive integer, may be coupled to each of the memory blocks MB1 to MBk. For example, the local lines LL may include a first select line, a second select line, and a plurality of word lines arranged between the first and second select lines. Here, the first select line may be a source select line, and the second select line may be a drain select line. Further, the local lines LL may include dummy lines arranged between the first select line and the word lines and between the second select line and the word lines. For example, the local lines LL may include word lines, drain and source select lines, and source lines. For example, the local lines LL may further include dummy lines. The local lines LL may further include one or more source lines.

Some of the local lines LL may be coupled to the memory blocks MB1 to MBk, respectively, or may be coupled in common to the plurality of memory blocks MB1 to MBk. The bit lines BL1 to BLm may be coupled in common to the memory blocks MB1 to MBk. The memory blocks MB1 to MBk may be implemented as a 3D structure. For example, in the memory blocks having a 3D structure, pages may be arranged in a direction vertical to a substrate. Here, a page means a group of memory cells coupled to the same word line.

The peripheral circuit 200 may be configured to perform program, read and erase operations on a selected memory block under the control of the control logic 300. For example, the peripheral circuit 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuit 200 may include a voltage generating circuit 210, a row decoder 220, a page buffer group 230, a column decoder 240, an input/output circuit 250, and a sensing circuit 260.

The voltage generating circuit 210 may include a plurality of voltage sources for respectively generating various operating voltages Vop to be used for program, read and erase operations in response to an operation code OP_CD. The respective voltage sources may independently generate voltages. Further, the voltage generating circuit 210 may allow the local lines LL to selectively float or may selectively apply voltages having various levels to the local lines LL in response to the operation code OP_CD. For example, the voltage generating circuit 210 may generate program voltages, verify voltages, pass voltages, select line voltages, read voltages, erase voltages, source line voltages, a ground voltage, and voltages having various levels under the control of the control logic 300.

In the case of a program operation, the voltage generating circuit 210 may apply a ground voltage for example, 0 V, a program voltage or pass voltages to the word lines. The voltage generating circuit 210 may selectively apply the ground voltage or a turn-on voltage to the first and second select lines. The voltage generating circuit 210 may allow the source lines to float or may apply a first precharge voltage to the source lines. The voltage generating circuit 210 may apply the ground voltage or a second precharge voltage to a well. Here, the first and second precharge voltages may be greater than the ground voltage and may be set to the same level or different levels.

The row decoder 220 may transfer the operating voltages Vop to the local lines LL coupled to the selected memory block among the plurality of memory blocks MB1 to MBk of the memory cell array 100 in response to a row address RADD.

The page buffer group 230 may include a plurality of page buffers PB1 to PBm coupled to the bit lines BL1 to BLm. The page buffers PB1 to PBm may be operated in response to page buffer control signals PBSIGNALS. For example, the page buffers PB1 to PBm may temporarily store data received through the bit lines BL1 to BLm or may sense the voltages or currents of the bit lines BL1 to BLm during a read or a verify operation.

The column decoder 240 may transfer data between the input/output circuit 250 and the page buffer group 230 in response to a column address CADD. For example, the column decoder 240 may exchange data with the page buffers PB1 to PBm through data lines DL or may exchange data with the input/output circuit 250 through column lines CL.

The input/output circuit 250 may transfer a command CMD and an address ADD, received from a memory controller for example, 1200 of FIG. 1, to the control logic 300, or may exchange data with the column decoder 240.

The sensing circuit 260 may generate a reference current in response to an enable bit VRY_BIT<#>. Further, the sensing circuit 260 may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuit 200 by outputting the operation code OP_CD, the row address RADD, the page buffer control signals PBSIGNALS, and the enable bit VRY_BIT<#> in response to the command CMD and the address ADD. Further, the control logic 300 may determine whether a verify operation has passed or failed in response to a pass or fail signal PASS or FAIL.

Figure 3:
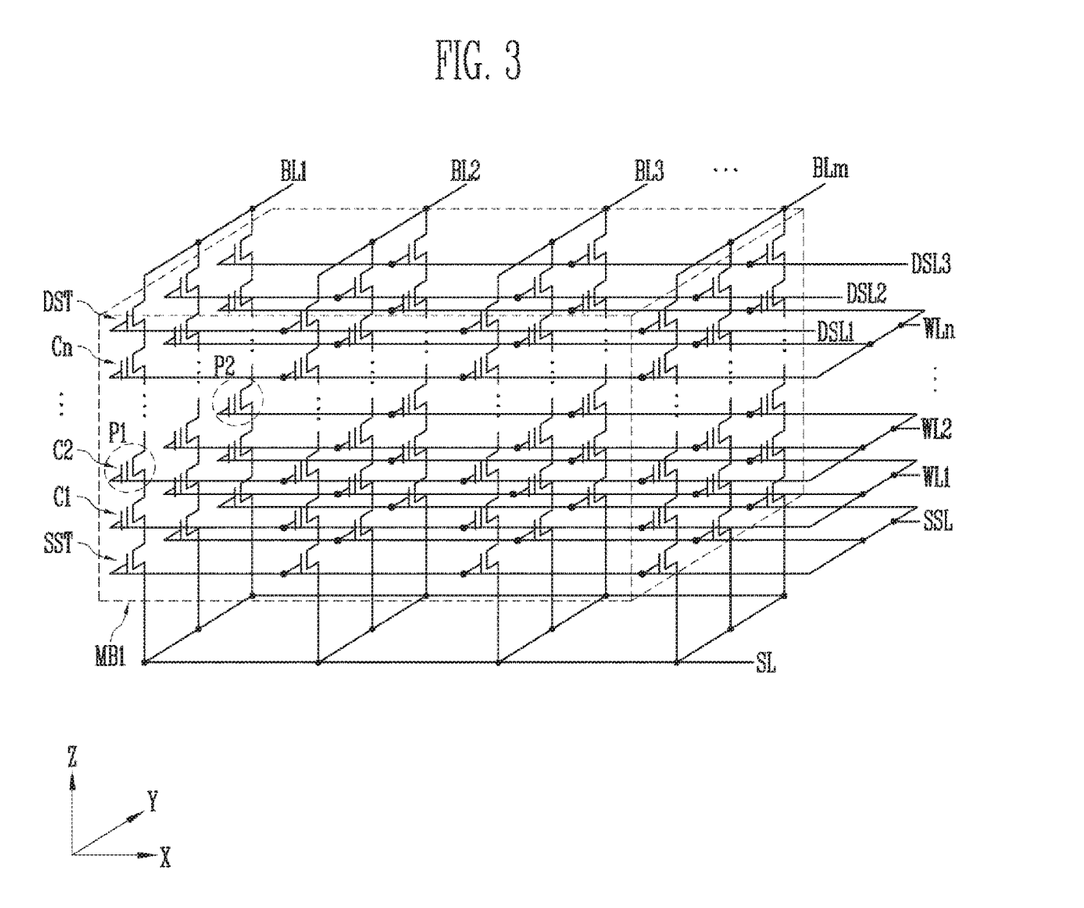
FIG. 3 is a circuit diagram illustrating a memory block in accordance with an embodiment of the present disclosure.

FIG. 3 is a diagram illustrating a memory block in accordance with an embodiment of the present disclosure, for example, the memory block MB1 of FIG. 2.

Referring to FIG. 3, the memory block MB1 formed as a 3D structure may include a plurality of strings coupled between a source line SL and bit lines BL1 to BLm. For example, the strings may include source select transistors SST, memory cells C1 to Cn, where n is a positive integer, and drain select transistors DST, which are coupled between the source line SL and the bit lines BL1 to BLm, where m is a positive integer.

Gates of the source select transistors SST included in different strings may be coupled to a source select line SSL, gates of the memory cells C1 to Cn may be coupled to word lines WL1 to WLn, and gates of the drain select transistors DST may be coupled to drain select lines DSL1 to DSL3. For example, the gates of the source select transistors SST may be coupled in common to the source select line SSL. For example, memory cells disposed on the same layer may be coupled in common to a certain word line, and memory cells disposed on different layers may be coupled to different word lines. For example, different bit lines BL1 to BLm are arranged in a first direction for example, X direction, and extended in a second direction for example, Y direction, drain select transistors DST that are coupled to different bit lines BL1 to BLm and are arranged in the first direction for example, X direction) may be coupled in common to any one of the drain select lines DSL1 to DSL3. The drain select transistors DST coupled in the second direction for example, Y direction may be coupled to different drain select lines.

Therefore, a program operation may be performed on a memory cell coupled to a selected bit line, a selected drain select line, and a selected word line. For example, when a first bit line BL1, a first drain select line DSL1, and a second word line WL2 are selected lines, a memory cell P1 coupled to the lines may be programmed. Here, memory cells P2 that are coupled to the first bit line BL1 and the second word line WL2, but are coupled to second and third drain select lines DSL2 and DSL3 that are unselected are not programmed.

Figure 4:
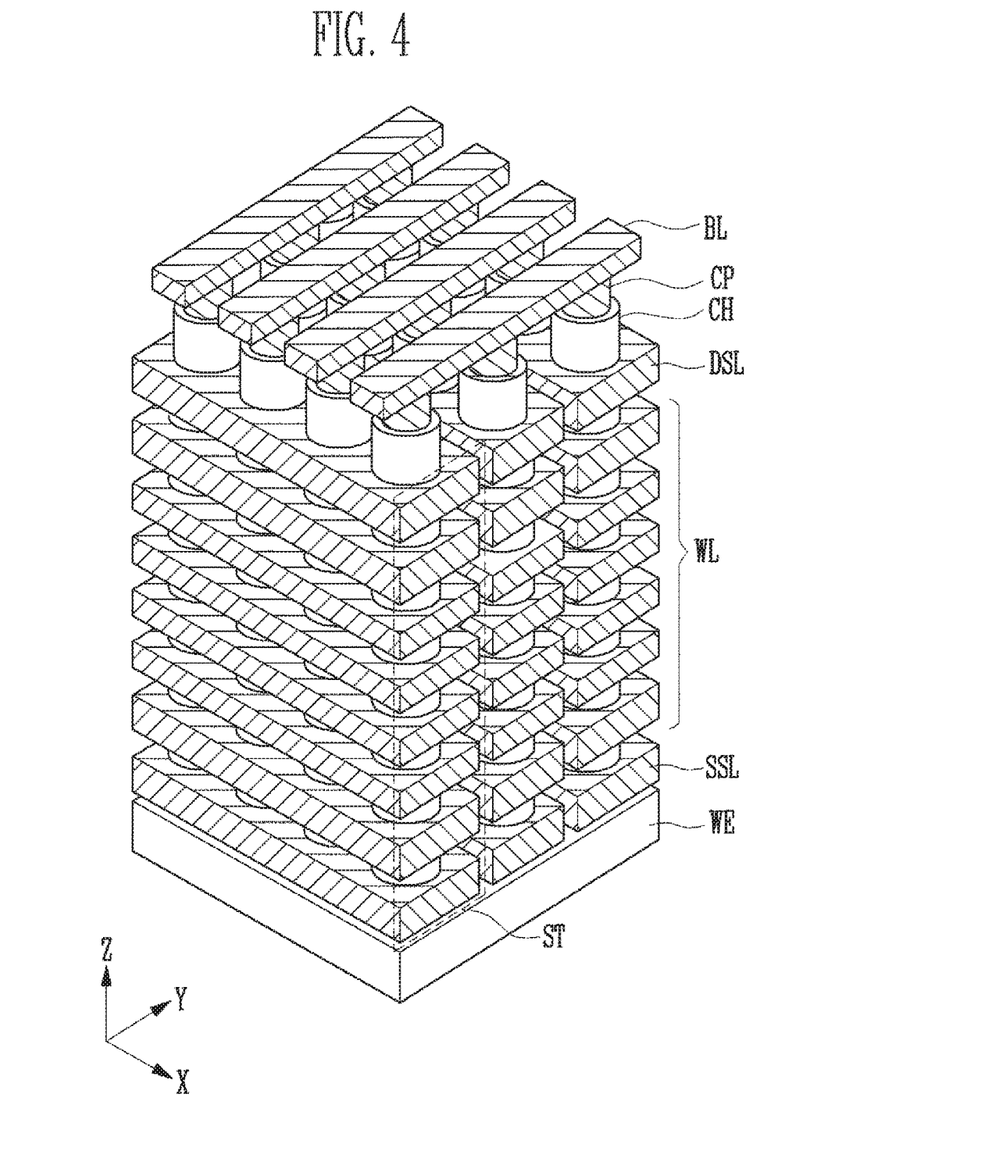
FIG. 4 is a perspective view illustrating a memory block in accordance with an embodiment of the present disclosure.

FIG. 4 is a perspective view illustrating a memory block in accordance with an embodiment of the present disclosure, for example, the memory block of FIG. 2.

Referring to FIG. 4, a memory block implemented as a 3D structure may include a plurality of strings ST formed in an I-shape and arranged on a substrate in a vertical direction for example, Z direction. The strings ST may be coupled between bit lines BL and a well WE. In the well WE, a source line may be formed or, alternatively, junctions in which a voltage applied to the source line is transferred may be formed. Such a structure is also referred to as a "Bit Cost Scalable (BiCS) structure". For example, the strings ST may be arranged in X and Y directions on the well WE. The strings ST may include source select lines SSL, word lines WL, and drain select lines DSL which are stacked on the well WE while being spaced apart from each other. The numbers of source select lines SSL, word lines WL, and drain select lines DSL are not limited to examples illustrated in the drawing, but may be different from each other depending on memory devices. The strings ST may include vertical channel layers CH that vertically pass through the source select lines SSL, the word lines WL, and the drain select lines DSL. The bit lines BL may be in contact with upper ends of the channel layers CH protruding upwardly from the drain select lines DSL and may be extended along the Y direction. The memory cells may be formed between the word lines WL and the vertical channel layers CH. Capping layers CP may be further formed between the bit lines BL and the vertical channel layers CH.

Figure 5:
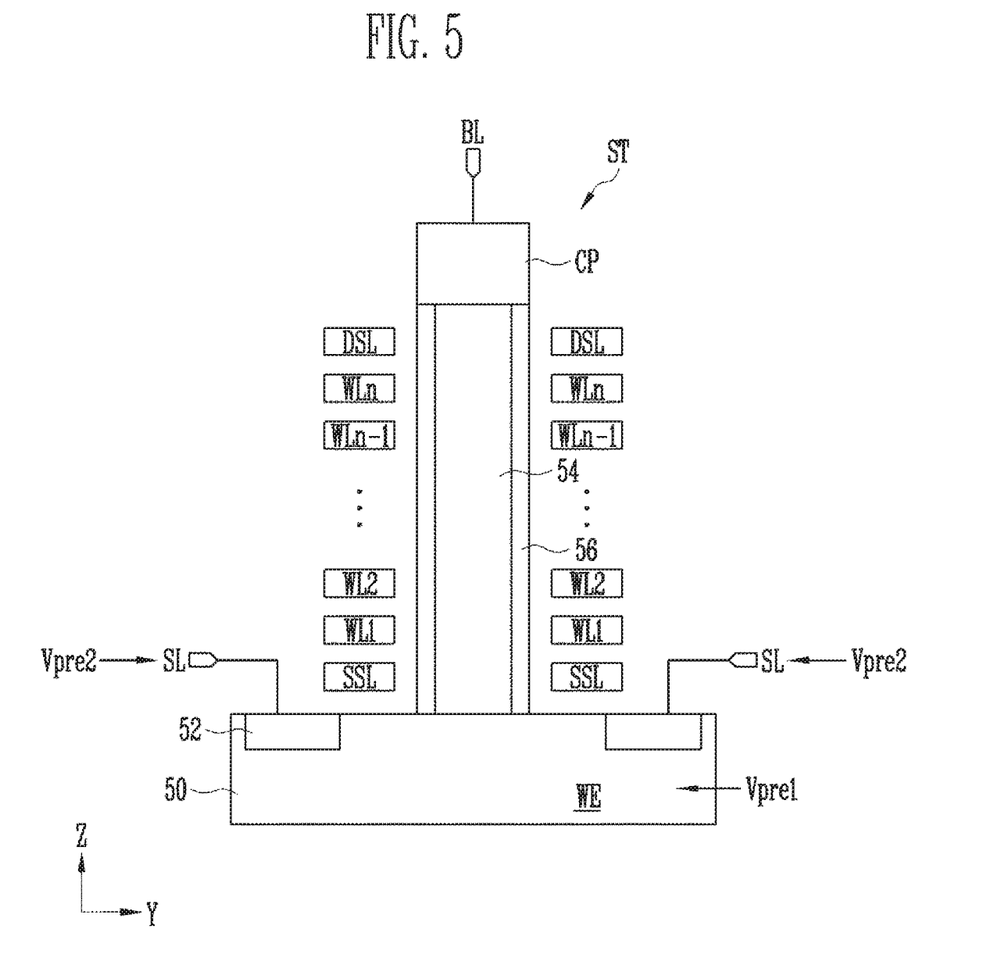
FIG. 5 is a sectional view illustrating the structure of a string in accordance with an embodiment of the present disclosure.

FIG. 5 is a sectional view illustrating the structure of a string in accordance with according to an embodiment of the present disclosure, for example, the structure of the string ST of FIG. 4.

Referring to FIG. 5, pillars 54 and 56 may be formed on a substrate in which a well WE is formed. The well WE may be formed by doping the substrate with impurities. In the well WE, junctions 52 may be formed. The junctions 52 may be formed by doping the substrate with a type of impurities different from that of the well WE. The pillars 54 and 56 may be formed on the top of the well WE between the junctions 52. The pillars 54 and 56 may include an internal insulating layer and a channel layer. The internal insulating layer may be made of a cylindrical insulating material. The channel layer may be implemented as a cylindrical polysilicon layer that encloses the internal insulating layer. A source select line SSL, word lines WL1 to WLn, and a drain select line DSL may be formed to be spaced apart from each other while enclosing the pillars 54 and 56. Source select transistors may be formed between the source select line SSL and the channel layer. Memory cells may be formed between the word lines WL1 to WLn and the channel layer. Drain select transistors may be formed between the drain select line DSL and the channel layer. A capping layer CP may be formed on the tops of the pillars 54 and 56. The capping layer CP may be implemented as a cylindrical polysilicon layer. The capping layer CP may be coupled to the bit line BL.

During a program operation, a first precharge voltage Vpre1 may be applied to the well WE. The source line SL may be coupled to the junctions 52, and a second precharge voltage Vpre2 may be applied to the source line SL during the program operation. For example, the first precharge voltage Vpre1 and the second precharge voltage Vpre2 may be generated from different voltage sources. The first precharge voltage Vpre1 and the second precharge voltage Vpre2 may be generated at the same level or at different levels.

Figure 6:
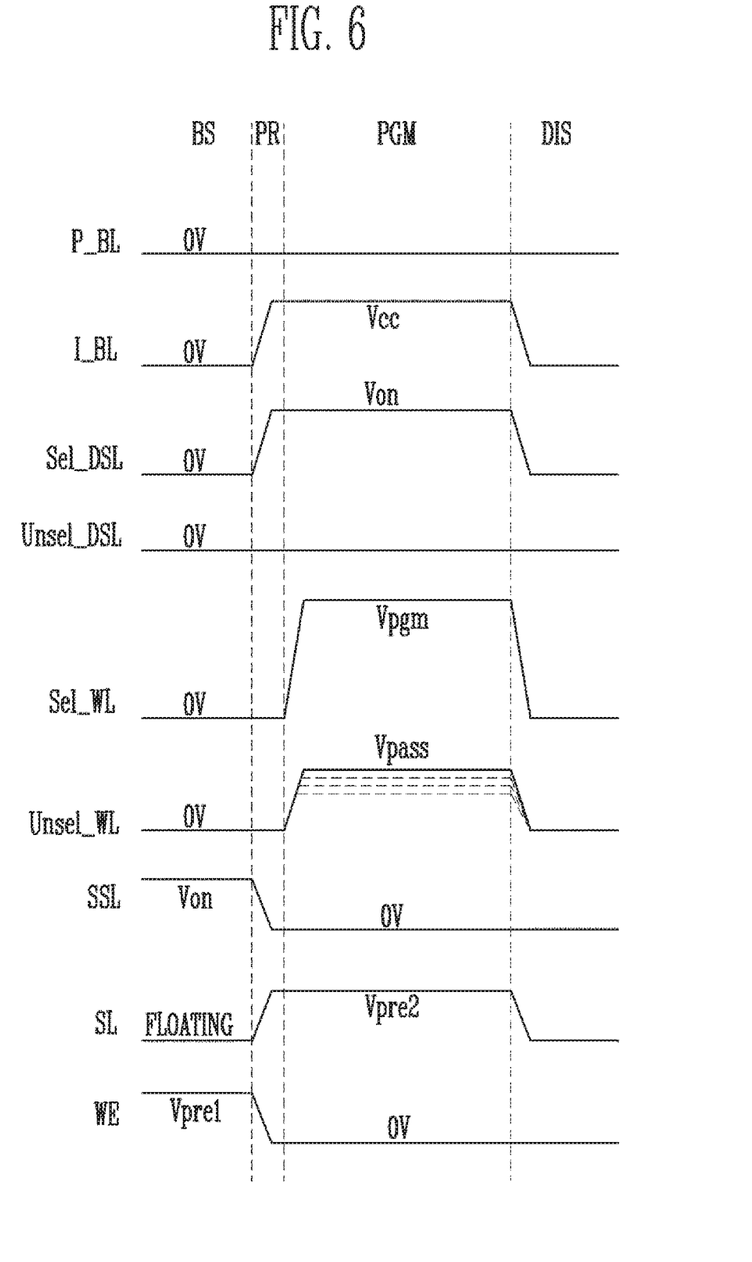
FIG. 6 is a timing diagram illustrating a program operation in accordance with an embodiment of the present disclosure.

FIG. 6 is a timing diagram illustrating a program operation in accordance with an embodiment of the present disclosure.

Referring to FIG. 6, the program operation may include a boosting period BS, a precharge period PR, a program period PGM, and a discharge period DIS.

During the boosting period BS, a ground voltage for example, 0 V may be applied to program bit lines P_BL, inhibit bit lines I_BL, a selected drain select line Sel_DSL, unselected drain select lines Unsel_DSL, a selected word line Sel_WL, and unselected word lines Unsel_WL. Here, a turn-on voltage Von may be applied to a source select line SSL, and a first precharge voltage Vpre1 may be applied to a well WE. Here, a source line SL may float. The turn-on voltage Von and the first precharge voltage Vpre1 may be set to positive voltages greater than the ground voltage.

Since the turn-on voltage Von is applied to the source select line SSL, source select transistors may be turned on, and then the first precharge voltage Vpre1 may be transferred to a channel layer for example, 56 of FIG. 5.

During the precharge period PR, the ground voltage may continue to be applied to the program bit lines P_BL, and an inhibit voltage for example, Vcc may be applied to the inhibit bit lines I_BL. In this case, the turn-on voltage Von may be applied to the selected drain select line Sel_DSL, and thus drain select transistors coupled to the selected strings may be turned on.

As a result, the channel voltages of strings selected from among the strings coupled to the selected drain select line Sel_DSL are decreased by the ground voltage applied to the program bit lines P_B and the channel voltages of unselected strings may be maintained at the precharge voltage by the inhibit voltage Vcc applied to the inhibit bit lines I_BL.

Here, the source select line SSL and the well WE may be discharged, and a second precharge voltage Vpre2 may be applied to the source line SL. The second precharge voltage Vpre2 may be set to a positive voltage greater than the ground voltage, for example, a voltage having a level similar to that of the first precharge voltage Vpre1.

When the source select line SSL is discharged, the source select transistors are turned off, so that the channels of the unselected strings may float with the precharge voltage applied thereto. Here, in the selected strings, the drain select transistors are turned on, and thus the channel voltages thereof may be maintained at low levels. For example, the channel voltages of the selected strings may be decreased to a ground voltage level.

When the channel voltages of the unselected strings are maintained at a precharge level, the second precharge voltage Vpre2 is also applied to the source line SL, and thus a decrease in the channel voltages of the unselected strings attributable to leakage may be prevented.

During the program period PGM, pass voltages Vpass may be applied to the unselected word lines Unsel_WL, and a program voltage Vpgm may be applied to the selected word line Sel_WL. The pass voltages Vpass may vary depending on the locations of the unselected word lines Unsel_WL. During the program period PGM, the second precharge voltage Vpre2 may continue to be applied to the source line SL in order to prevent the channel voltages of the unselected strings from decreasing.

During the discharge period DIS, the above-described lines P_BL, I_BL, Sel_DSL, Unsel_DSL, Sel_WL, Unsel_WL, SSL, and SL and the well WE may be discharged to perform a subsequent operation.

Figure 7:
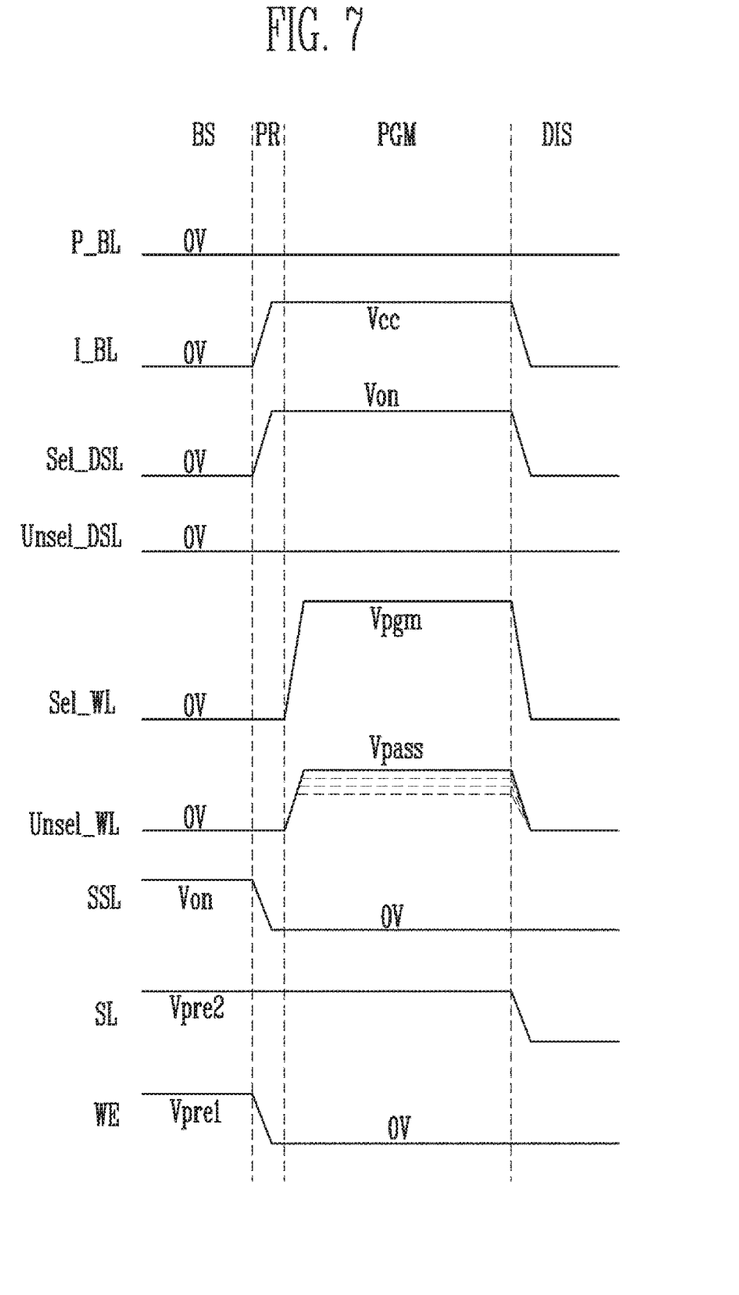
FIG. 7 is a timing diagram illustrating a program operation in accordance with an embodiment of the present disclosure.

FIG. 7 is a timing diagram illustrating a program operation in accordance with an embodiment of the present disclosure.

Referring to FIG. 7, the program operation may include a boosting period BS, a precharge period PR, a program period PGM, and a discharge period DIS.

During the boosting period BS, a ground voltage for example, 0 V may be applied to program bit lines P_BL, inhibit bit lines I_BL, a selected drain select line Sel_DSL, unselected drain select lines Unsel_DSL, a selected word line Sel_WL, and unselected word lines Unsel_WL. Here, a turn-on voltage Von may be applied to a source select line SSL, a first precharge voltage Vpre1 may be applied to a well WE, and a second precharge voltage Vpre2 may be applied to a source line SL. The turn-on voltage Von, the first precharge voltage Vpre1, and the second precharge voltage Vpre2 may be set to positive voltages greater than the ground voltage. The first precharge voltage Vpre1 and the second precharge voltage Vpre2 may be set to similar levels.

Since the turn-on voltage Von is applied to the source select line SSL, source select transistors are turned on, and thus the precharge voltage may be transferred to a channel layer for example, 56 of FIG. 5. For example, when the first precharge voltage Vpre1 and the second precharge voltage Vpre2 have the same level, the first or second precharge voltage Vpre1 or Vpre2 may be applied to the channel layer. For example, when the first precharge voltage Vpre1 is greater than the second precharge voltage Vpre2, the first precharge voltage Vpre1 may be applied to the channel layer. For example, when the second precharge voltage Vpre2 is greater than the first precharge voltage Vpre1, the second precharge voltage Vpre2 may be applied to the channel layer.

During the precharge period PR, the ground voltage may continue to be applied to the program bit lines P_B and an inhibit voltage for example, Vcc may be applied to the inhibit bit lines I_BL. In this case, the turn-on voltage Von may be applied to the selected drain select line Sel_DSL, and thus drain select transistors coupled to the selected strings may be turned on.

Accordingly, the channel voltages of strings selected from among the strings coupled to the selected drain select line Sel_DSL are decreased by the ground voltage applied to the program bit lines P_B and the channel voltages of unselected strings may be maintained at the precharge voltage by the inhibit voltage Vcc applied to the inhibit bit lines I_BL.

Here, the source select line SSL and the well WE may be discharged, and the second precharge voltage Vpre2 may continue to be applied to the source line SL. When the source select line SSL is discharged, the source select transistors are turned off, so that the channels of the unselected strings may float with the precharge voltage applied thereto. Here, in the selected strings, the drain select transistors are turned on, and thus the channel voltages thereof may be maintained at low levels. For example, the channel voltages of the selected strings may be decreased to a ground voltage level.

When the channel voltages of the unselected strings are maintained at a precharge level, the second precharge voltage Vpre2 is also applied to the source line SL, and thus a decrease in the channel voltages of the unselected strings attributable to leakage may be prevented.

During the program period PGM, pass voltages Vpass may be applied to the unselected word lines Unsel_WL, and a program voltage Vpgm may be applied to the selected word line Sel_WL. The pass voltages Vpass may vary depending on the locations of the unselected word lines Unsel_WL. During the program period PGM, the second precharge voltage Vpre2 may continue to be applied to the source line SL in order to prevent the channel voltages of the unselected strings from decreasing.

During the discharge period DIS the above-described lines P_BL, I_BL, Sel_DSL, Unsel_DSL, Sel_WL, Unsel_WL, SSL, and SL and the well WE may be discharged to perform a subsequent operation.

Figure 8:
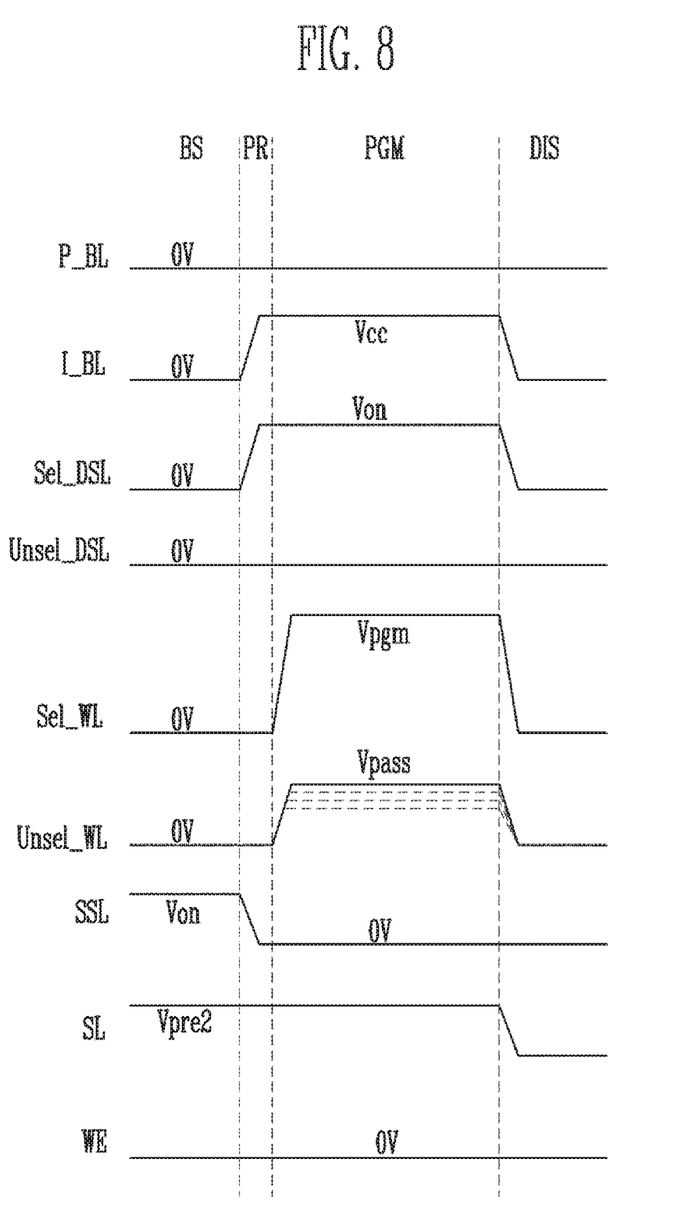
FIG. 8 is a timing diagram illustrating a program operation in accordance with an embodiment of the present disclosure.

FIG. 8 is a timing diagram illustrating a program operation in accordance with an embodiment of the present disclosure.

Referring to FIG. 8, the program operation may include a boosting period BS, a precharge period PR, a program period PGM, and a discharge period DIS.

During the boosting period BS, a ground voltage for example, 0 V may be applied to program bit lines P_BL, inhibit bit lines a selected drain select line Sel_DSL, unselected drain select lines Unsel_DSL, a selected word line Sel_WL, and unselected word lines Unsel_WL, and a turn-on voltage Von may be applied to a source select line SSL. Here, a second precharge voltage Vpre2 may be applied to a source line SL, and the ground voltage for example, 0 V) may be applied to a well WE. The turn-on voltage Von and the second precharge voltage Vpre2 may be set to positive voltages greater than the ground voltage (0 V).

Since the turn-on voltage Von is applied to the source select line SSL, source select transistors coupled to the source select line SSL are turned on, and thus the second precharge voltage Vpre2 may be transferred to a channel layer for example, 56 of FIG. 5.

During the precharge period PR, the ground voltage may continue to be applied to the program bit lines P_BL, and an inhibit voltage for example, Vcc may be applied to the inhibit bit lines I_BL. In this case, the turn-on voltage Von may be applied to the selected drain select line Sel_DSL, and thus drain select transistors coupled to the selected strings may be turned on.

Accordingly, the channel voltages of strings selected from among the strings coupled to the selected drain select line Sel_DSL are decreased by the ground voltage applied to the program bit lines P_BL, and the channel voltages of unselected strings may be maintained at the precharge voltage by the inhibit voltage Vcc applied to the inhibit bit lines I_BL.

Here, the source select line SSL may be discharged, and the second precharge voltage Vpre2 may continue to be applied to the source line SL. When the source select line SSL is discharged, the source select transistors are turned off, so that the channels of the unselected strings may float with the precharge voltage applied thereto. Here, in the selected strings, the drain select transistors are turned on, and thus the channel voltages thereof may be maintained at low levels. For example, the channel voltages of the selected strings may be decreased to a ground voltage level.

When the channel voltages of the unselected strings are maintained at a precharge level, the second precharge voltage Vpre2 is also applied to the source line SL, and thus a decrease in the channel voltages of the unselected strings attributable to leakage may be prevented.

During the program period PGM, pass voltages Vpass may be applied to the unselected word lines Unsel_WL, and a program voltage Vpgm may be applied to the selected word line Sel_WL. The pass voltages Vpass may vary depending on the locations of the unselected word lines Unsel_WL. During the program period PGM, the second precharge voltage Vpre2 may continue to be applied to the source line SL in order to prevent the channel voltages of the unselected strings from decreasing.

During the discharge period DIS, the above-described lines P_BL, I_BL, Sel_DSL, Unsel_DSL, Sel_WL, Unsel_WL, SSL, and SL and the well WE may be discharged to perform a subsequent operation.

Further, during an erase operation other than the program operation, different erase voltages may be applied to the source line SL and the well WE, respectively. An embodiment of the erase operation will be described below.

Figure 9:
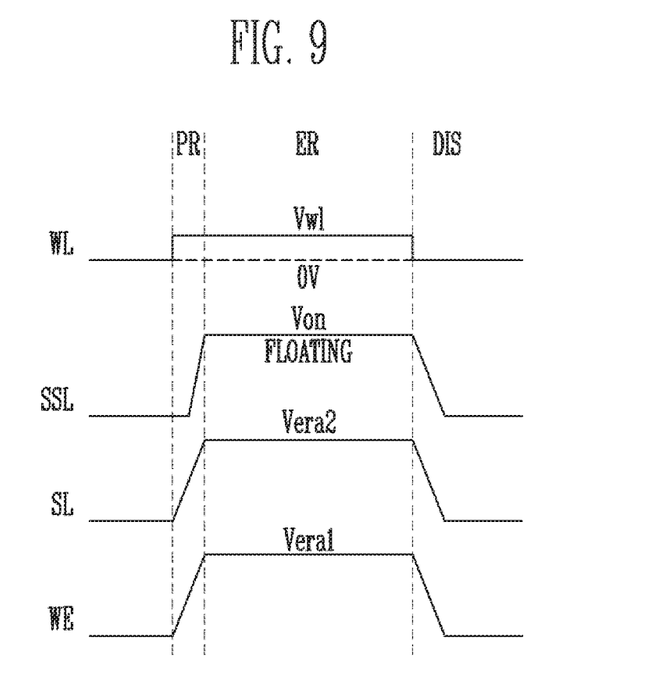
FIG. 9 is a timing diagram illustrating an erase operation in accordance with an embodiment of the present disclosure.

FIG. 9 is a timing diagram illustrating an erase operation in accordance with an embodiment of the present disclosure.

Referring to FIG. 9, a first erase voltage Vera1 may be applied to a well WE, and a second erase voltage Vera2 may be applied to a source line SL. For example, during a precharge period PR, the first and second erase voltages Vera1 and Vera2 may be applied to the well WE and the source line SL, respectively. Here, the time at which the first erase voltage Vera1 is applied to the well WE and the time at which the second erase voltage Vera2 is applied to the source line SL may be identical to or different from each other.

A ground voltage for example, 0 V or a word line voltage Vwl may be applied to word lines WL so that electrons trapped in memory cells may be de-trapped. For example, the word line voltage Vwl may be set to a level that is greater than that of the ground voltage (0 V) and that is less than those of the first and second erase voltages Vera1 and Vera2.

When the level of the first or second erase voltage Vera1 or Vera2 is increased, the turn-on voltage Von may be applied to the source select line SSL. For example, the turn-on voltage Von may be applied to the source select line SSL during the precharge period PR. The turn-on voltage Von may be set to a value between the ground voltage (0 V) and the first or second erase voltage Vera1 or Vera2, or may be set to a value identical to the first or second erase voltage Vera1 or Vera2.

If all of the first and second erase voltages Vera1 and Vera2 and the turn-on voltage Von have reached target levels, an erase period ER is initiated, and the source select line SSL may float.

When a discharge period DIS is initiated after the erase period ER has been executed for a predetermined period of time, the source select line SSL, the source line SL, and the well WE may be discharged. When the word line voltage Vwl is applied to the word lines WL, the word lines WL may also be discharged.

Figure 10:
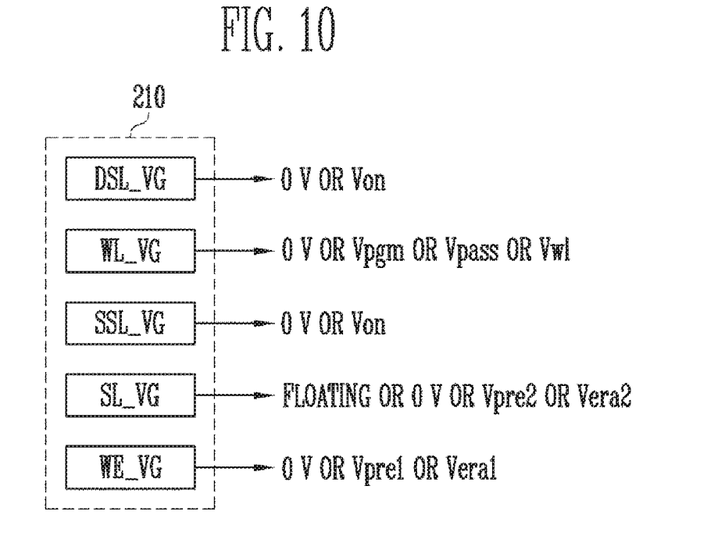
FIG. 10 is a diagram illustrating voltage sources in accordance with an embodiment of the present disclosure.

FIG. 10 is a diagram illustrating voltage sources according to an embodiment of the present disclosure.

Referring to FIG. 10, the voltage generating circuit 210 of FIG. 2 may include a plurality of voltage sources for selectively generating voltages having various levels. The voltage sources may be operated independently of each other. For example, the voltage generating circuit 210 may include a drain select line voltage source DSL_VG, a word line voltage source WL_VG, a source select line voltage source SSL_VG, a source line voltage source SL_VG, and a well voltage source WE_VG. Voltages generated by the voltage generating circuit 210 during a program operation or an erase operation will be described in detail below.

The drain select line voltage source DSL_VG may generate the ground voltage for example, 0 V or the turn-on voltage Von to be applied to drain select lines for example, DSL of FIG. 5.

The word line voltage source WL_VG may generate the ground voltage, a program voltage Vpgm, a pass voltage Vpass or the word line voltage Vwl to be applied to word lines for example, WL1 to WLn of FIG. 5.

The source select line voltage source SSL_VG may generate the ground voltage or the turn-on voltage Von to be applied to the source select lines for example, SSL of FIG. 5.

The source line voltage source SL_VG may allow the source line for example, SL of FIG. 5 to float or may generate the ground voltage (0 V). Alternatively, the source line voltage source SL_VG may generate a second operating voltage. The second operating voltage may include a second precharge voltage Vpre2 or a second erase voltage Vera2.

The well voltage source WE_VG may generate the ground voltage (0 V) to be applied to the well for example, WE of FIG. 5. Alternatively, the well voltage source WE_VG may generate a first operating voltage. The first operating voltage may include a first precharge voltage Vpre1 or a first erase voltage Vera1.

The above-described turn-on voltage Von, program voltage Vpgm, pass voltage Vpass, word line voltage Vwl, first and second precharge voltages Vpre1 and Vpre2, and first and second erase voltages Vera1 and Vera2 may be set to positive voltages greater than the ground voltage (0 V). The first precharge voltage Vpre1 and the second precharge voltage Vpre2 may be set to similar levels, and the first erase voltage Vera1 and the second erase voltage Vera2 may be set to similar levels.

Figure 11:
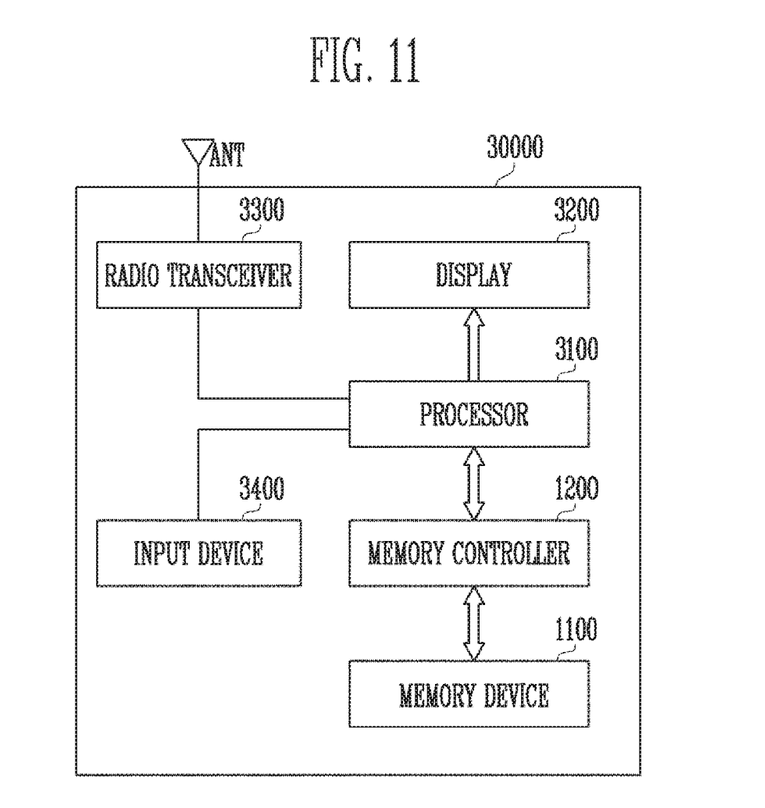
FIG. 11 is a diagram illustrating a memory system including a memory device in accordance with an embodiment of the present disclosure.

FIG. 11 is a diagram illustrating a memory system 30000 including a memory device according to an embodiment of the present disclosure, for example, the memory device 1100 illustrated in FIG. 2.

Referring to FIG. 11, the memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, for example, a program, erase, or read operation, of the memory device 1100 under the control of a processor 3100.

Data programmed in the memory device 1100 may be outputted through a display 3200 under the control of the memory controller 1200.

A radio transceiver 3300 may transmit and receive radio signals through an antenna ANT. For example, the radio transceiver 3300 may convert a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may convert a signal outputted from the processor 3100 into a radio signal, and output the converted radio signal to the external device through the antenna ANT. An input device 3400 may be used to input a control signal for controlling the operation of the processor 3100 or data to be processed by the processor 3100. The input device 3400 may be implemented as a pointing device such as a touch pad, a computer mouse, a keypad or a keyboard. The processor 3100 may control the operation of the display 3200 such that data outputted from the memory controller 1200, data outputted from the radio transceiver 3300, or data outputted from the input device 3400 is outputted through the display 3200.

In an embodiment, the memory controller 1200 capable of controlling the operation of the memory device 1100 may be implemented as a part of the processor 3100 or a chip provided separately from the processor 3100.

Figure 12:
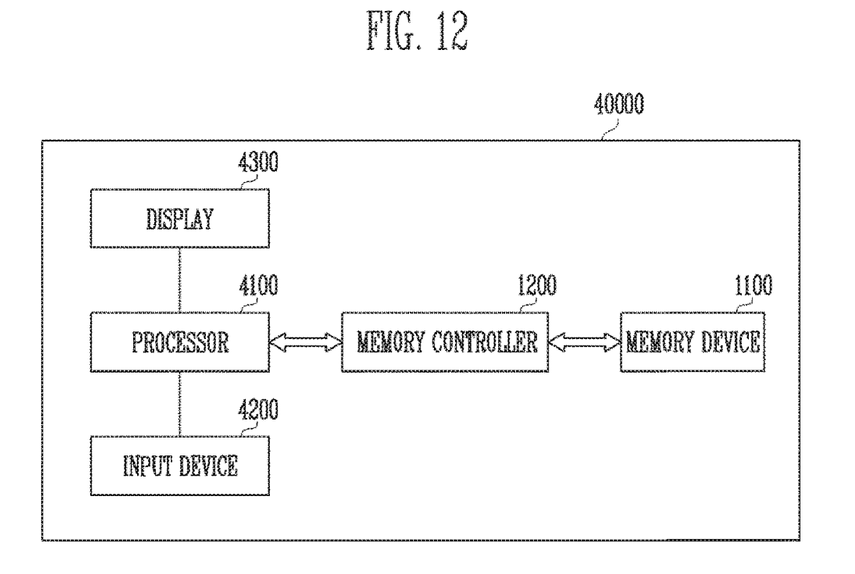
FIG. 12 is a diagram illustrating a memory system including a memory device in accordance with an embodiment of the present disclosure.

FIG. 12 is a diagram illustrating a memory system 40000 including a memory device in accordance with an embodiment of the present disclosure, for example, the memory device 1100 illustrated in FIG. 2.

Referring to FIG. 12, the memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data inputted from an input device 4200. For example, the input device 4200 may be implemented as a pointing device such as a touch pad, a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 13:
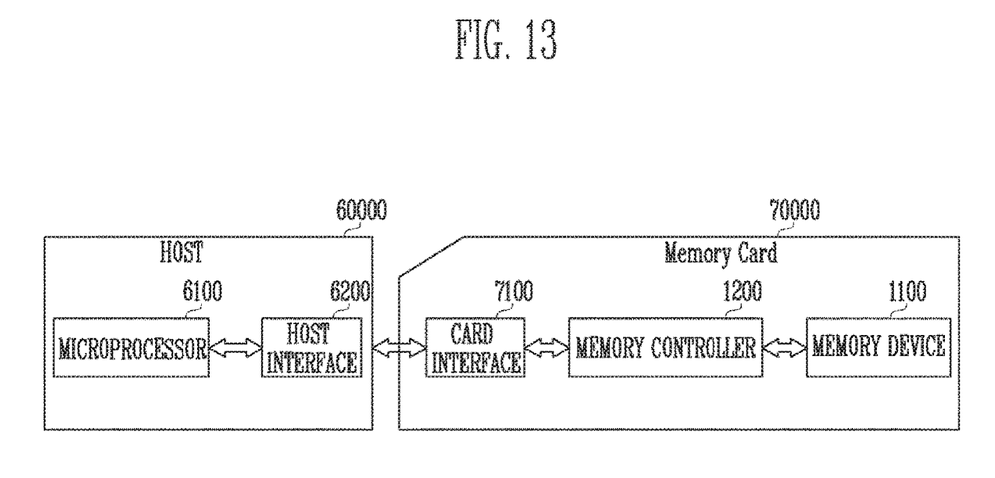
FIG. 13 is a diagram illustrating a memory system including a memory device in accordance with an embodiment of the present disclosure.

FIG. 13 is a diagram illustrating a memory system 70000 including a memory device in accordance with an embodiment of the present disclosure, for example, the memory device 1100 illustrated in FIG. 2.

Referring to FIG. 13, the memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a personal computer (PC), a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The present disclosure may improve the reliability of a program operation of a memory device.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device, comprising:
   a memory block including a channel layer formed between junctions included in a well, and a source select line, word lines, and drain select lines that are sequentially stacked on the well while enclosing the channel layer;
   a first voltage source configured to generate a first operating voltage to be applied to the well during a program operation or an erase operation; and
   a second voltage source configured to generate a second operating voltage to be applied to source lines that are coupled to the junctions during the program operation or the erase operation.

2. The memory device according to claim 1, wherein the first voltage source and the second voltage source are operated independently of each other.

3. The memory device according to claim 1, wherein:
   the first operating voltage comprises at least one of a first precharge voltage used in the program operation, and a first erase voltage used in the erase operation, and
   the second operating voltage comprises at least one of a second precharge voltage used in the program operation, and a second erase voltage used in the erase operation.

4. The memory device according to claim 3, wherein, during the program operation, when the first voltage source generates the first operating voltage, the second voltage source is configured to:
   allow the source lines to float, or
   generate the second operating voltage simultaneously with generation of the first operating voltage.

5. The memory device according to claim 4, wherein, when the source lines float, the second voltage source generates the second operating voltage if the well is discharged after the first operating voltage has been applied to the well for a predetermined period of time.

6. The memory device according to claim 4, wherein, when the second voltage source generates the second operating voltage simultaneously with the generation of the first operating voltage, the second voltage source continues to generate the second operating voltage if the well is discharged after the first operating voltage has been applied to the well for a predetermined period of time.

7. The memory device according to claim 1, further comprising other voltage sources configured to generate voltages to be applied to the source select line, the word lines, and the drain select lines, respectively.

8. The memory device according to claim 7, wherein the other voltage sources are operated independently of each other.

9. The memory device according to claim 7, wherein, among the other voltage sources, a third voltage source for generating a voltage to be applied to the source select line is configured to apply a turn-on voltage to the source select line such that the first operating voltage is transferred to the channel layer when the first operating voltage is applied to the well.

10. The memory device according to claim 9, wherein the third voltage source is configured to discharge the source select line while the well is discharged.

* * * * *